United States Patent
Gomm et al.

(10) Patent No.: US 11,115,007 B2
(45) Date of Patent: Sep. 7, 2021

(54) METHODS AND APPARATUSES OF A TWO-PHASE FLIP-FLOP WITH SYMMETRICAL RISE AND FALL TIMES

(71) Applicant: MICRON TECHNOLOGY, INC., Boise, ID (US)

(72) Inventors: Tyler J. Gomm, Boise, ID (US); Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/294,640

(22) Filed: Mar. 6, 2019

(65) Prior Publication Data

US 2019/0207592 A1 Jul. 4, 2019

Related U.S. Application Data

(63) Continuation of application No. 15/717,610, filed on Sep. 27, 2017, now Pat. No. 10,270,431.

(51) Int. Cl.

| | |
|---|---|
| *H03K 3/037* | (2006.01) |
| *H03K 3/017* | (2006.01) |
| *H03K 19/20* | (2006.01) |
| *G11C 11/4074* | (2006.01) |
| *G11C 11/408* | (2006.01) |

(Continued)

(52) U.S. Cl.
CPC .......... *H03K 3/0372* (2013.01); *H03K 3/017* (2013.01); *G11C 7/106* (2013.01); *G11C 7/222* (2013.01); *G11C 11/4074* (2013.01); *G11C 11/4076* (2013.01); *G11C 11/4085* (2013.01);

(Continued)

(58) Field of Classification Search
CPC ...... H03K 3/037; H03K 3/0372; H03K 19/20; H03K 19/21; H03K 19/212; H03K 19/215; H03K 19/217; H03K 19/23; H03K 3/012; H03K 17/002; H03K 17/007; H03K 17/005; G11C 11/4074; G11C 11/4085; G11C 11/4087
See application file for complete search history.

(56) References Cited

U.S. PATENT DOCUMENTS

| | | | |
|---|---|---|---|
| 5,596,296 A | 1/1997 | Asazawa | |
| 6,246,278 B1 * | 6/2001 | Anderson | H03K 5/151 |
| | | | 327/295 |

(Continued)

OTHER PUBLICATIONS

International Search Report and Written Opinion dated Jan. 18, 2019 for PCT application PCT/US2018/052445, 10 pages.

(Continued)

*Primary Examiner* — Patrick C Chen
(74) *Attorney, Agent, or Firm* — Dorsey & Whitney LLP (57) ABSTRACT

Methods and apparatuses of a two-phase flip-flop with symmetrical rise and fall times are disclosed herein. An example apparatus may include a clock generator circuit including a two-phase flip-flop circuit configured to provide an output signal. The two-phase flip-flop circuit includes a two-phase flip-flop and a driver circuit. The two-phase flip-flop is configured to provide a first driver control signal and a second driver control signal responsive to a clock signal. The first driver control signal and the second driver control signal are complementary. The driver circuit is configured to provide the output signal responsive to the first driver control signal and the second driver control signal.

16 Claims, 9 Drawing Sheets

(51) Int. Cl.
 G11C 11/4076 (2006.01)
 G11C 7/10 (2006.01)
 G11C 11/4093 (2006.01)
 G11C 7/22 (2006.01)
(52) U.S. Cl.
 CPC ....... *G11C 11/4087* (2013.01); *G11C 11/4093* (2013.01); *H03K 19/20* (2013.01)

(56) References Cited

U.S. PATENT DOCUMENTS

| | | | | |
|---|---|---|---|---|
| 6,825,695 | B1* | 11/2004 | Dhong | G06F 1/10 326/95 |
| 2003/0030474 | A1* | 2/2003 | McGowan | H03K 3/012 327/202 |
| 2003/0190007 | A1* | 10/2003 | Dedic | H03M 1/0836 375/377 |
| 2003/0197526 | A1 | 10/2003 | Hirano | |
| 2004/0135611 | A1* | 7/2004 | Tohsche | H03K 3/012 327/218 |
| 2004/0155804 | A1* | 8/2004 | Dedic | H03M 1/0836 341/144 |
| 2007/0188200 | A1 | 8/2007 | Jeong | |
| 2008/0235638 | A1 | 9/2008 | Mo | |
| 2012/0146697 | A1 | 6/2012 | Leach et al. | |
| 2014/0232442 | A1 | 8/2014 | Bartling et al. | |
| 2015/0263708 | A1 | 9/2015 | Elkin et al. | |
| 2017/0012611 | A1 | 1/2017 | Escobar et al. | |

OTHER PUBLICATIONS

PCT Patent Application No. PCT/US18/52445 titled "Methods and Apparatuses of a Two-Phase Flip-Flop With Symmetrical Rise and Fall Times" filed Sep. 24, 2018, pp. all.

U.S. Appl. No. 15/717,610 entitled "Methods and Apparatuses of a Two-Phase Flip-Flop With Symmetrical Rise and Fall Times" filed Sep. 27, 2017, pp. all.

\* cited by examiner

METHODS AND APPARATUSES OF A TWO-PHASE FLIP-FLOP WITH SYMMETRICAL RISE AND FALL TIMES

CROSS-REFERENCE TO RELATED APPLICATION

This application is a continuation of U.S. patent application Ser. No. 15/717,610, filed Sep. 27, 2017, which issued as U.S. Pat. No. 10,270,431 on Apr. 23, 2019. These application and patent are incorporated by reference herein in their entirety and for all purposes.

BACKGROUND

The pursuit of making computing systems more powerful, more power efficient, and more compact has led to increased operating speeds and lower power consumption. A critical component of operating at high clock speeds is maintaining synchronous clocks between parts of a system. With high clock speeds, even a small duty cycle or phase error can lead to errors with in a system.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

In high speed applications, accurate duty cycles of clocks are important to maintain reliable communication within and between devices in a computing system. Often, in applications clocks are divided to simplify distribution of the clock throughout a device. In some examples, an input clock may be divided and a two-phase output clock via a series of flip-flops, where a count of flip-flops determines a divisor for the divided clock. The downstream circuitry may use a rising edge of the true and complementary divided clock signals to clock circuitry. However, in conventional applications, rise and fall times of each of the divided clock signals may be different due to drive strength mismatches between P-type and N-type circuits (e.g., devices, components, transistors, etc.), which may cause duty cycle errors between and within the divided clock signal, and may cause errors when the divided clocks signals are recombined to regenerate an input clock signal.

Figure 1:
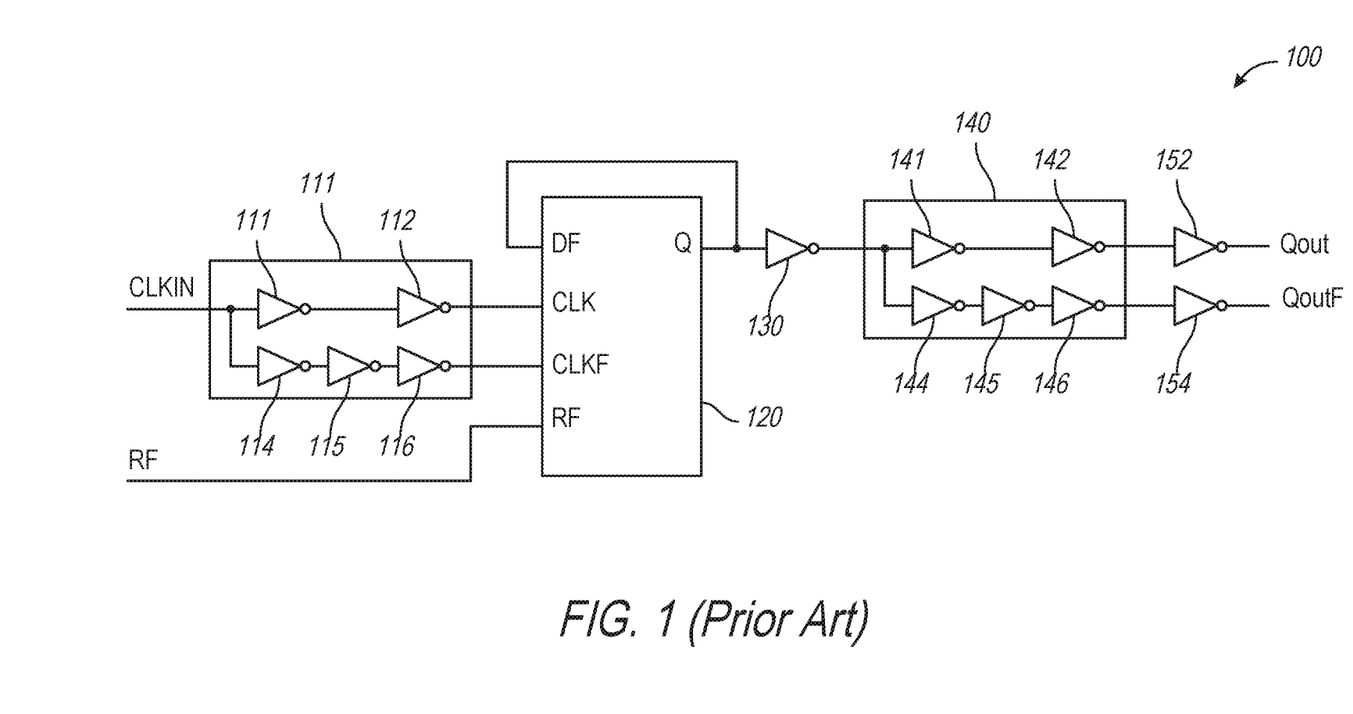
FIG. 1 is a prior art schematic illustration of a two-phase clock circuit in accordance with embodiments of the disclosure.
Figure 2:
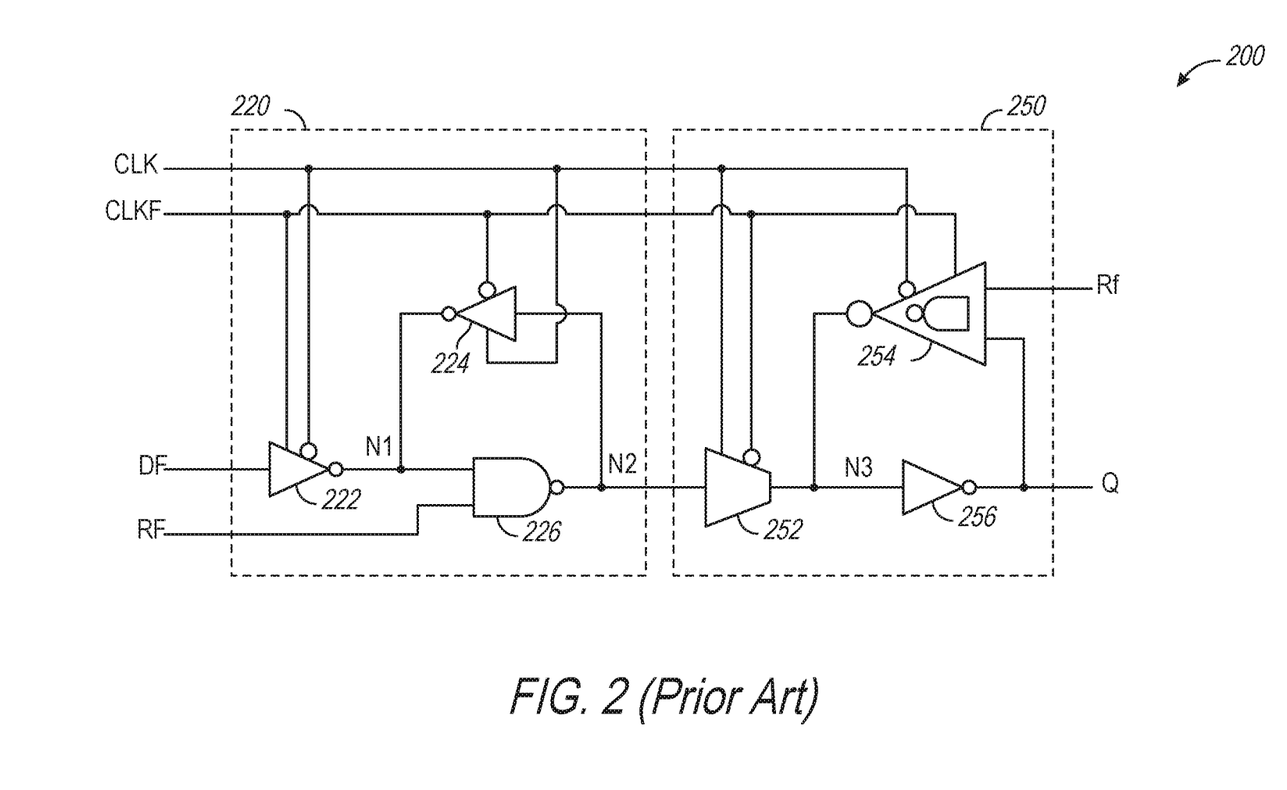
FIG. 2 is a prior art schematic illustration of a flip-flop circuit in accordance with embodiments of the disclosure.

For example, FIGS. 1 and 2 are schematic illustrations of a two-phase clock circuit in accordance with embodiments of the disclosure. FIG. 1 depicts a two-phase clock circuit 100 having a phase splitter 110, a flip-flop 120, an inverter 130, and inverters 152 and 154 and a phase splitter 140. The two-phase clock circuit 100 may receive an input clock signal CLKIN and provide two-phase clock signals QOUT (e.g., true output clock signal) and QOUTF (e.g., complement output clock signal). The QOUT and QOUTF signals are complementary such that the polarity of the QOUT signal is opposite the polarity of the QOUTF signal. Also, because there is only a single flip-flop 120, the output of QOUT and QOUTF signals have twice a period of the CLKIN signal.

The phase splitter 110 may include serially-coupled inverters 111 and 112 to receive the CLKIN signal and provide a true clock signal CLK to the flip-flop 120. The phase splitter 110 may further include serially-coupled inverters 114, 115, and 116 to receive the CLKIN signal and provide a complementary clock signal CLKF to the flip-flop 120. Because there are two serially-coupled inverters 111 and 112 to provide the CLK signal and three serially-coupled inverters 114, 115, and 116 to provide the CLKF signal, the drives strengths of the inverters are adjusted such that the delay through the two serially-coupled inverters 111 and 112 matches the delay through the three serially-coupled inverters 114, 115, and 116.

The flip-flop 120 may provide an input signal DF to the output signal Q in response to the CLK and CLKF signals received from the phase splitter 110. The Q signal may be fed back as the DF signal, such that the Q signal transitions to an opposite logic level (e.g., from a high to a low logic level or from a low to a high logic level) with every CLK cycle. The flip-flop 120 may further receive a complement reset signal RF to reset the flip-flop 120.

The Q signal may be provided through the inverter 130 to the phase splitter 140. Similar to the phase splitter 110, the phase splitter 140 may include serially-coupled inverters 141 and 142 to receive the inverted Q signal and provide the QOUT signal via the inverter 152. The phase splitter 140 may further include serially-coupled inverters 144, 145, and 146 to receive the inverted Q signal and provide the QOUTF signal via the inverter 154. Because there are two serially-coupled inverters 141 and 142 to provide the QOUT signal and three serially-coupled inverters 144, 145, and 146 to provide the QOUTF signal, the drives strengths of the inverters are adjusted such that the delay through the two serially-coupled inverters 141 and 142 matches the delay through the three serially-coupled inverters 144, 145, and 146. The inverter 130 and inverters 152 and 154 may be stepped up to increase drive strength for provision of the QOUT and QOUTF signals to downstream circuitry.

The use of the inverter 130, the phase splitter 140, which includes inverters 141, 142, 144, 145, and 146, and the inverters 152 and 154 may result in different rise and fall times of the QOUT and QOUTF signals, because the N-type components of each of the inverter 130, the phase splitter 140, which includes inverters 141, 142, 144, 145, and 146, and the inverters 152 and 154 may have different drive strengths than the P-type components. The difference in rise and fall times may cause clock timing errors.

FIG. 2 depicts a flip-flop circuit 200 having a master latch 220 and a slave latch 250. The flip-flop circuit 200 may be implemented in the flip-flop 120 of FIG. 1. The master latch 220 may include a clocked inverter 222, a clocked inverter 224, and a NAND gate 226. The slave latch 250 may include a passgate 252, a clocked NAND gate 254, and an inverter 256.

The clocked inverter 222 may receive a complement input signal DF and provide a signal to the node N1 in response to the CLK and CLKF signals. The NAND gate 226 may receive the node N1 signal and a complement reset signal RF, and provide an output to the node N2 based on the node N1 signal and the RF signal using NAND logic. The inverter 224 may receive the node N2 signal and may provide an output signal to the node N1 in response to the CLK and CLKF signals. The clocked inverter 222 and the NAND gate 226 may be implemented in a forward gate and feedback gate to improve setup time and improve CLK-to-Q time.

The passgate 252 may receive the node N2 signal and may provide a signal to node N3 in response to the CLK and CLKF signals. The passgate 252 acts as a latch that holds the node N2 value at the node N3 for a single clock period. The inverter 256 may invert the node N3 signal to provide the Q signal at an output. The clocked NAND gate 254 may use NAND logic to provide a signal to the node N3 based on the Q signal and the RF signal, with the output of the clocked NAND gate 254 clocked in response to the CLK and CLKF signal. That is, rather than being updated continuously, the output of the clocked NAND gate 254 is only updated periodically in response to the CLK and CLKF signals to latch the state.

As shown in FIG. 2, the flip-flop circuit 200 only provides a single phase output clock signal Q, and requires use of other circuitry as described with reference to FIG. 1 to provide the complementary two-phase QOUT and QOUTF signals, which may result in timing errors caused by different rise and fall times of the QOUT and QOUTF signals. Because of the sequential propagation through the clocked inverter 222, the passgate 252, and the inverter 256, a propagation delay of the DF signal to the Q signal is approximately a 3-gate delay (e.g., if the passgate delay is negligible).

Figure 3:
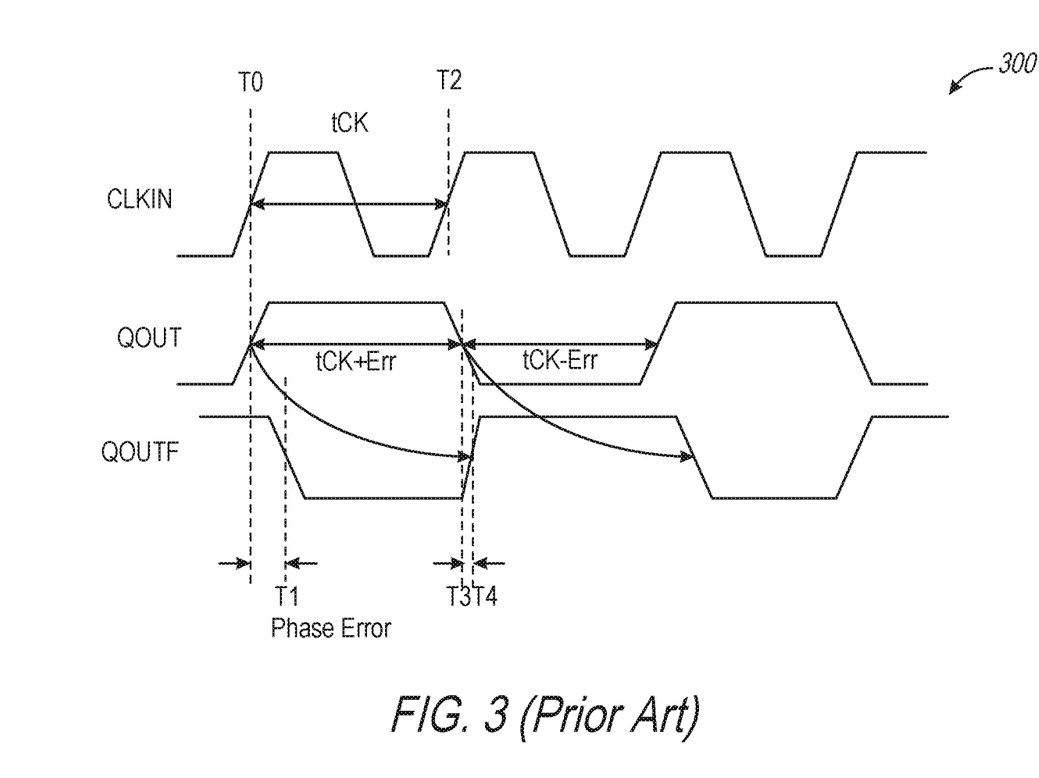
FIG. 3 is an exemplary timing diagram depicting operation of a two-phase clock circuit in accordance with embodiments of the disclosure.

As previously described, the implementations of the apparatus 100 of FIG. 1 and the flip-flop circuit 200 of FIG. 2 may lead to timing errors in the QOUT and QOUTF signals. FIG. 3 is an exemplary timing diagram 300 depicting operation of the apparatus 100 of FIG. 1 having timing errors. The CLKIN signal, the QOUT signal, and the QOUTF signals may correspond to the CLKIN signal, the QOUT signal, and the QOUTF signal, respectively, of FIG. 1. The CLKIN signal may have a clock period tCK between times T0 and T2. At time T0, the CLKIN signal and the QOUT signal both transition from low to high. However, as shown in the timing diagram, the QOUTF signal has a fall time that is different than the rise time of the QOUT signal, so the QOUTF signal does not transition from high to low until time T1.

At time T2, the CLKIN signal transitions from low to high. However, the QOUT signal does not transition from high to low until time T3, making the clock period of the QOUT signal tCK plus an error from time T2 to time T3. Similarly, the QOUTF signal does not transition from low to high until time T4, making the clock period of the QOUTF signal tCK minus an error from time T0 to time T1 and plus an error from time T2 to time T4. These phase errors may cause timing errors in downstream circuitry.

Figure 4:
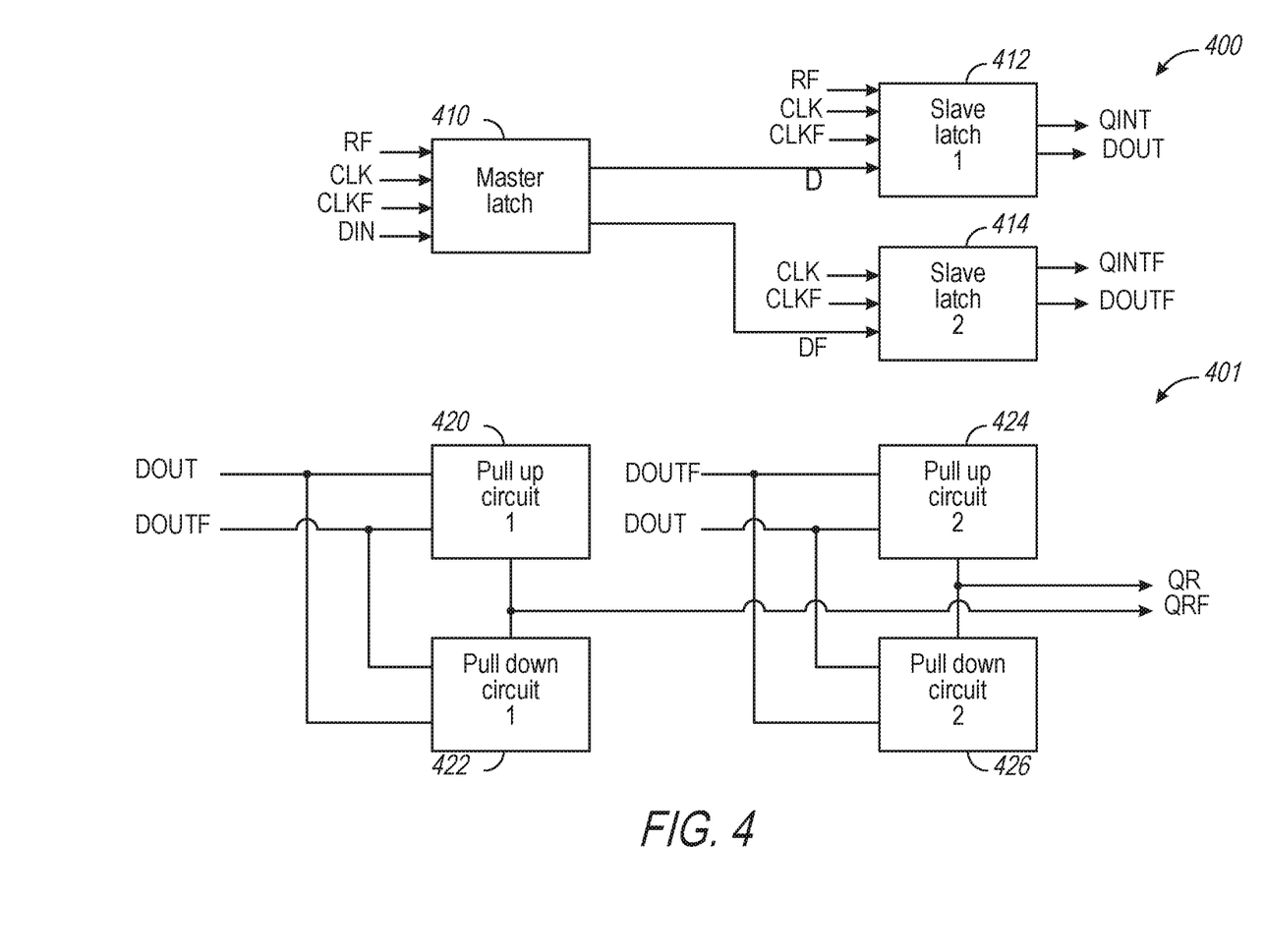
FIG. 4 is a block diagram of a two-phase flip-flop and a driver circuit in accordance with embodiments of the disclosure.

FIG. 4 is block diagram of a two-phase flip-flop 400 and a driver circuit 401 in accordance with embodiments of the disclosure. The two-phase flip-flop 400 includes a master latch 410 and a first slave latch 412 and a second slave latch 414. The master latch 410 may receive a complement reset signal RF (e.g., which resets the output of the master latch 410), an input signal DIN, a clock signal CLK and a complement clock signal CLKF, and may latch a true output signal D and a complement output signal DF at an output responsive to the CLK and CLKF signals. The CLK and CLKF signals are complementary such that the polarity of the CLK signal is opposite the polarity of the CLKF signal. Additionally, the D and DF signals are complementary such that the polarity of the D signal is opposite the polarity of the DF signal. In some examples, transition of the DF signal relative to the D signal may be delayed by one inverter delay.

The first slave latch 412 may receive the RF signal (e.g., which may be used to reset the output of the first slave latch 412), the D signal, the CLK signal, and the CLKF signal, and may latch the D signal responsive to the CLK and CLKF signals and provide a DOUT signal (e.g., a first driver control signal) at an output. The first slave latch 412 may also provide an internal output signal QINT, which, in some examples, such as a clock divider example, may be fed back to the DIN signal to allow the two-phase flip-flop to be configured as a toggle flip-flop (e.g., the output signals D and DF each transition from a high to a low logic level or from a low to a high logic level) with every cycle of the CLK signal. The second slave latch 414 may receive a reset signal R (e.g., which may be used to reset the output of the second slave latch 414), the DF signal, the CLK signal, and the CLKF signal, and may latch the DF signal responsive to the CLK and CLKF signals and provide a DOUTF signal (e.g., a second driver control signal) at an output. The second slave latch 414 may also provide an internal output signal QINTF, which is a complement of the QINT signal. The DOUT and the DOUTF signals are complementary such that the polarity of the DOUT signal is opposite the polarity of the DOUTF signal. The first slave latch 412 may latch the DOUT signal contemporaneously (e.g., simultaneously) with the second slave latch 414 latching of the DOUTF signal.

The driver circuit 401 may include a first pull-up circuit 420, a first pull-down circuit 422, a second pull-up circuit 424, and a second pull-down circuit 426. The first pull-up circuit 420 and the first pull-down circuit 422 may drive a complement output signal QRF responsive to the DOUT signal and the DOUTF signal from the two-phase flip-flop 400. That is, the first pull-up circuit 420 may pull the QRF signal up to a logical high voltage based on a VDD voltage responsive to the DOUT signal being low and the DOUTF signal being high. The first pull-down circuit 422 may pull the QRF signal down to a logical low voltage based on a VSS voltage responsive to the DOUT signal being high and the DOUTF signal being low. The first pull-up circuit 420 and the first pull-down circuit 422 may include symmetrical circuits such that each has both p-type devices and n-type devices. For example, the first pull-up circuit 420 and the first pull-down circuit 422 may each have a p-type transistor (e.g., controlled by the DOUT signal in the first pull-up circuit 420 and controlled by the DOUTF signal in the first pull-down circuit 422) coupled in parallel with an n-type transistor (e.g., controlled by the DOUTF signal in the first pull-up circuit 420 and controlled by the DOUT signal in the first pull-down circuit 422). Using the symmetrical circuits in the first pull-up circuit 420 and the first pull-down circuit 422 may reduce rise and fall time variance for the QRF signal, as compared with circuitry of FIGS. 1 and 2 because the drive strength mismatch between N and P devices cancel each other out in the symmetrical first pullup circuit 420 and first pull-down circuit 422 (e.g., one type of each device in each circuit).

Similar to the first pull-up circuit 420 and the first pull-down circuit 422, the second pull-up circuit 424 and the second pull-down circuit 426 may drive a true output signal QR responsive to the DOUT signal and the DOUTF signal from the two-phase flip-flop 400. The second pull-up circuit 424 may pull the QR signal up to a logical high voltage based on the VDD voltage responsive to the DOUT signal being high and the DOUTF signal being low. The second pull-down circuit 426 may pull the QR signal down to a logical low voltage based on the VSS voltage responsive to the DOUT signal being low and the DOUTF signal being high. The QR and QRF signals are complementary such that the polarity of the QR signal is opposite the polarity of the QRF signal. The second pull-up circuit 424 and the second pull-down circuit 426 may include symmetrical circuits such that each has both p-type devices and n-type devices. For example, the second pull-up circuit 424 and the second pull-down circuit 426 may each have a p-type transistor (e.g., controlled by the DOUTF signal in the second pull-up circuit 424 and controlled by the DOUT signal in the second pull-down circuit 426) coupled in parallel with an n-type transistor (e.g., controlled by the DOUT signal in the second pull-up circuit 424 and controlled by the DOUTF signal in the second pull-down circuit 426). Using the symmetrical circuits in the second pull-up circuit 424 and the second pull-down circuit 426 may reduce rise and fall time variance for the QR signal, as compared with circuitry of FIGS. 1 and 2, because the drive strength mismatch between N and P devices cancel each other out in the symmetrical first pullup circuit 420 and first pull-down circuit 422 (e.g., one type of each device in each circuit).

While the driver circuit 401 depicts two pairs of pull-up and pull-down circuits to provide two-phase clock signals QR and QRF (e.g., a first pair including the first pull-up circuit 420 and the first pull-down circuit 422 to provide the QRF signal, and a second pair including the second pull-up circuit 424 and the second pull-down circuit 426 to provide the QR signal), it is understood that some embodiments the driver circuit may only include a single one pair of pull-up and pull-down circuits to provide a single phase clock signal (e.g., either the QR or the QRF signal) without departing from the scope of the disclosure. One advantage of the single phase driver circuit is that the sizes of the pull-up and pull-down circuits may be increased to allow increased drive strength of the QR or QRF signal. Implementation of the symmetrical pull-up 420 and 424 and pull-down 422 and 426 passgate circuits driven by the complementary D and DF signals (e.g., provided by the two-phase flip-flop 400) in the driver circuit 401 may reduce variance between the rise and fall times of each of the QR and the QRF signals as compared with the circuitry of FIGS. 1 and 2. Reducing variance between the rise and fall times in the QR and QRF signals may reduce timing errors of each of the QR and QRF signals as compared with the circuitry of FIGS. 1 and 2.

Figure 5:
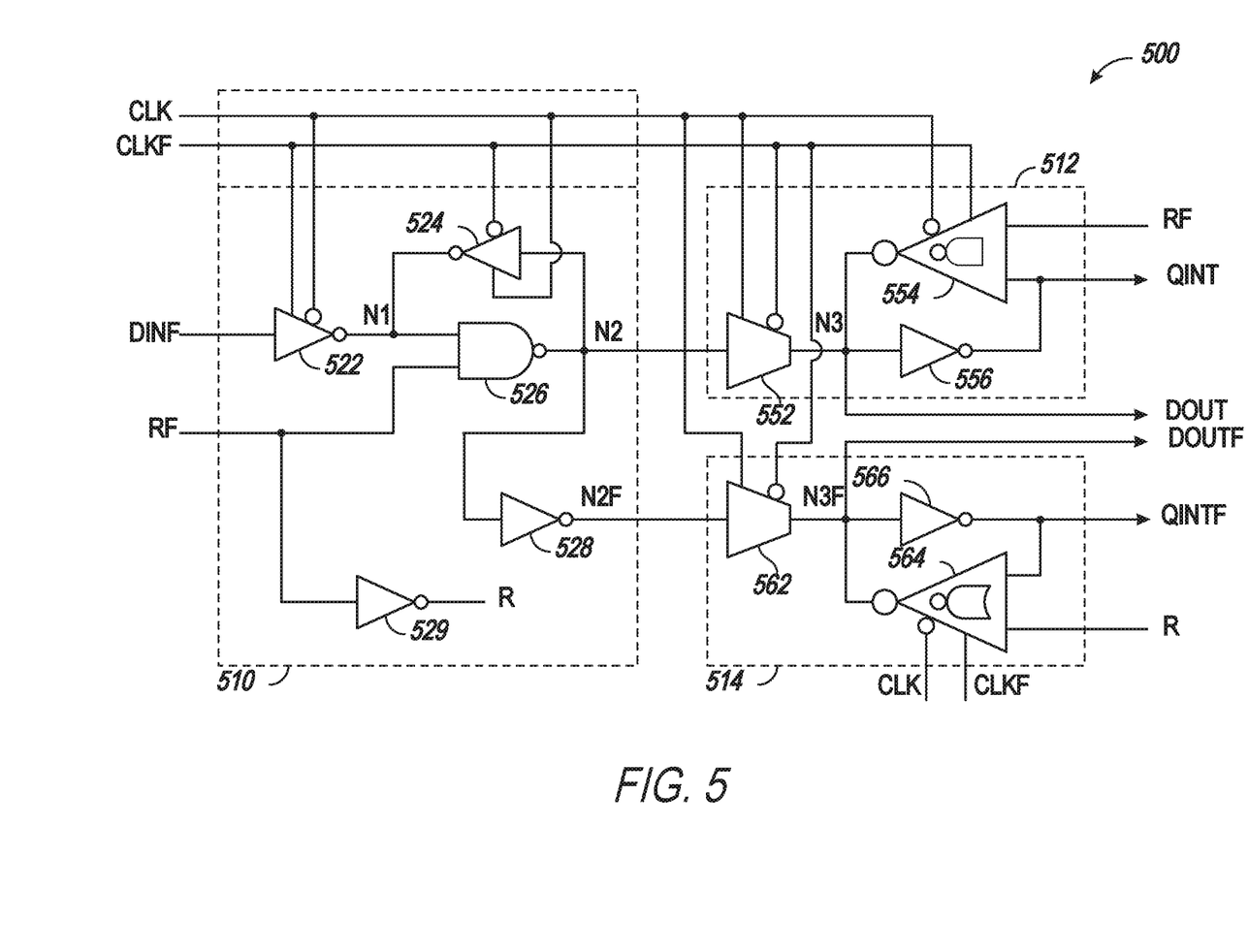
FIG. 5 is a schematic illustration of a two-phase flip-flop in accordance with an embodiment of the disclosure.

FIG. 5 is a schematic illustration of a two-phase flip-flop 500 in accordance with an embodiment of the disclosure. The two-phase flip-flop 500 may include master latch 510, a first slave latch 512, and a second slave latch 514. The two-phase flip-flop 500 may be implemented in the 400 of FIG. 4.

The master latch 510 may include a clocked inverter 522, a clocked inverter 524, a NAND gate 526, and an inverter 528. The first slave latch 512 may include a passgate 552, a clocked NAND gate 554, and an inverter 556. The second slave latch 514 may include a passgate 562, a clocked NOR gate 564, and an inverter 566.

The clocked inverter 522 may receive a complement input signal DINF and provide a signal to the node N1 in response to the CLK and CLKF signals. The DINF signal may correspond to a complement of the DIN signal of FIG. 4, in some examples. The NAND gate 526 may receive the node N1 signal and a complement reset signal RF, and provide an output to the node N2 based on the node N1 signal and the RF signal using NAND logic. The clocked inverter 524 may receive the node N2 signal and may provide an output signal to the node N1 in response to the CLK and CLKF signals. The clocked inverter 522 and the NAND gate 526 may be implemented in a forward gate and feedback gate to improve setup time and improve CLK-to-QR time. The inverter 528 may provide invert the node N2 signal to provide a complement node N2F signal. The node N2 signal and the node N2F signal may correspond to the D and DF signals in the flip-flop circuit 400 of FIG. 4.

The passgate 552 may receive the node N2 signal and may provide the node N2 signal to node N3 in response to the CLK and CLKF signals. The passgate 552 acts as a latch that holds (e.g., latches) the node N2 signal value at the node N3 for a single clock period. The inverter 556 may invert the node N3 signal to provide an internal output signal QINT at an output. The node N3 provides the DOUT signal (e.g., a first driver control signal). The clocked NAND gate 554 may use NAND logic to provide a signal to the node N3 based on the QINT signal and the RF signal, with the output of the clocked NAND gate 554 clocked in response to the CLK and CLKF signal. That is, rather than being updated continuously, the output of the clocked NAND gate 554 is only updated periodically in response to the CLK and CLKF signals. In some examples, such as a clock divider example, the QINT signal may be fed back to the DINF signal to configure the two-phase flip-flop 500 as a toggle flip-flop (e.g., the output signals DOUT and DOUTF each transition from a high to a low logic level or from a low to a high logic level) with every cycle of the CLK signal.

The passgate 562 may receive the node N2F signal and may provide the node N2F signal to node N3F in response to the CLK and CLKF signals. The passgate 562 acts as a latch that holds (e.g., latches) the node N2F signal value at the node N3F for a single clock period. Because the passgate 562 and the passgate 552 are both controlled responsive to the CLK and CLKF signals, the passgate 562 and the passgate 552 may each latch the respective signals contemporaneously (e.g., simultaneously). The node N3F provides the DOUTF signal. The inverter 566 may invert the node N3F signal to provide an internal output signal QINTF at an output. The clocked NOR gate 564 may use NOR logic to provide a signal to the node N3F based on the QINT signal and a reset signal, with the output of the clocked NOR gate 564 clocked in response to the CLK and CLKF signal. That is, rather than being updated continuously, the output of the clocked NOR gate 564 is only updated periodically in response to the CLK and CLKF signals.

While the time for propagation of the DINF signal to the N2F node is a gate delay of the inverter 528 longer than propagation of the DINF signal to the N2 node. However, the gate delay of the inverter 528 allows the value at the N2F node to settle before the passgate 562 is clocked by the CLK and CLKF signals to pass the value of the node N2F through to the node N3F at the same time the value of the node N2 through to the node N3 via the passgate 552. Because circuitry of the first slave latch 512 and the second slave latch 514 are similar, the node N3 and the node N3F are both updated at the same time, making the DOUT and the DOUTF signals complementary.

As compared with the flip-flop circuit 200 of FIG. 2, which only provides a single phase output signal Q, the provision of the complementary, two-phase DOUT and DOUTF signals from the two-phase flip-flop 500 may provide control signaling for symmetrical pull-up and pull-down circuitry to drive output signals with reduced variance between rise and fall times as compared with the circuitry of FIGS. 1 and 2.

Figure 6:
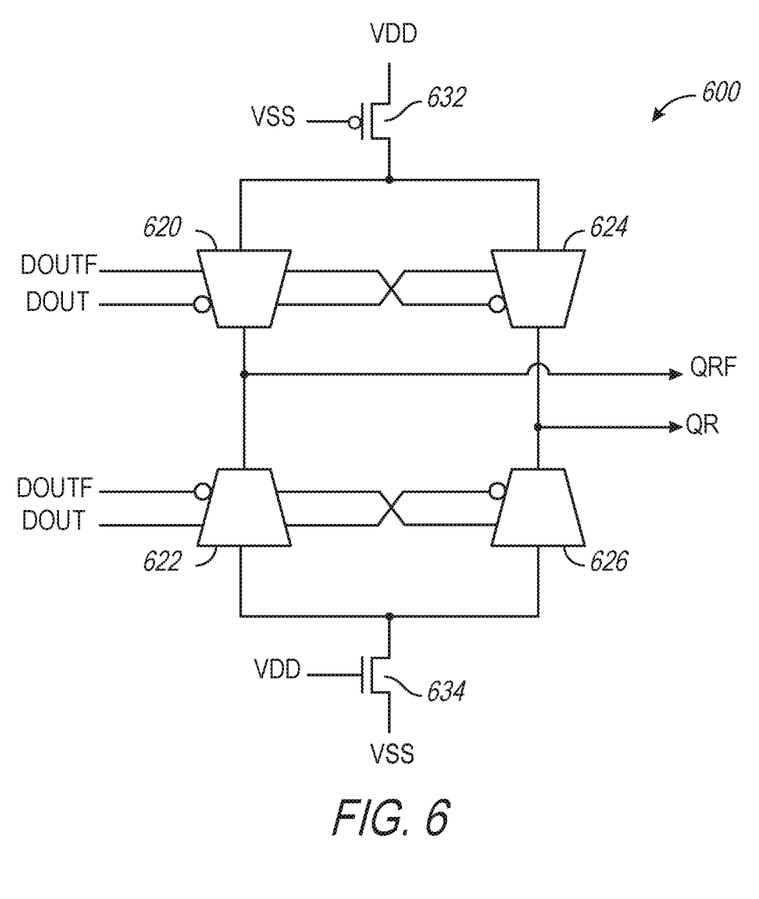
FIG. 6 is schematic illustration of a driver circuit in accordance with embodiments of the disclosure.

FIG. 6 is schematic illustration of a driver circuit 600 in accordance with embodiments of the disclosure. The driver circuit 600 may include a first pull-up passgate circuit 620, a first pull-down passgate circuit 622, a second pull-up passgate circuit 624, and a second pull-down passgate circuit 626. The first pull-up passgate circuit 620 and the first pull-down passgate circuit 622 may drive a complement output signal QRF responsive to the DOUT signal and the DOUTF signal (e.g., from the two-phase flip-flop 400 of FIG. 4 or the two-phase flip-flop 500 of FIG. 5). That is, the first pull-up passgate circuit 620 may pull the QRF signal up to a logical high voltage based on a VDD voltage responsive to the DOUT signal being low and the DOUTF signal being high. The first pull-down passgate circuit 622 may pull the QRF signal down to a logical low voltage based on a VSS voltage responsive to the DOUT signal being high and the DOUTF signal being low. The first pull-up passgate circuit 620 and the first pull-down passgate circuit 622 may include symmetrical circuits such that each has both p-type devices and n-type devices. For example, the first pull-up passgate circuit 620 and the first pull-down passgate circuit 622 may each have a p-type transistor (e.g., controlled by the DOUT signal in the first pull-up passgate circuit 620 and controlled by the DOUTF signal in the first pull-down passgate circuit 622) coupled in parallel with an n-type transistor (e.g., controlled by the DOUTF signal in the first pull-up passgate circuit 620 and controlled by the DOUT signal in the first pull-down passgate circuit 622). Using the symmetrical circuits in the first pull-up passgate circuit 620 and the first pull-down passgate circuit 622 may reduce rise and fall time variance for the QRF signal, as compared with circuitry of FIGS. 1 and 2.

Similar to the first pull-up passgate circuit 620 and the first pull-down passgate circuit 622, the second pull-up passgate circuit 624 and the second pull-down passgate circuit 626 may drive a true output signal QR responsive to the DOUT signal and the DOUTF signal. The second pull-up passgate circuit 624 may pull the QR signal up to a logical high voltage based on the VDD voltage responsive to the DOUT signal being high and the DOUTF signal being low. The second pull-down passgate circuit 626 may pull the QR signal down to a logical low voltage based on the VSS voltage responsive to the DOUT signal being low and the DOUTF signal being high. The QR and QRF signals are complementary such that the polarity of the QR signal is opposite the polarity of the QRF signal. The second pull-up passgate circuit 624 and the second pull-down passgate circuit 626 may include symmetrical circuits such that each includes both p-type devices and n-type devices. For example, the second pull-up passgate circuit 624 and the second pull-down passgate circuit 626 may each have a p-type transistor (e.g., controlled by the DOUTF signal in the second pull-up passgate circuit 624 and controlled by the DOUT signal in the second pull-down passgate circuit 626) coupled in parallel with an n-type transistor (e.g., controlled by the DOUT signal in the second pull-up passgate circuit 624 and controlled by the DOUTF signal in the second pull-down passgate circuit 626). Using the symmetrical circuits in the second pull-up passgate circuit 624 and the second pull-down passgate circuit 626 may reduce rise and fall time variance for the QR signal, as compared with circuitry of FIGS. 1 and 2.

The driver circuit 600 may optionally include a transistor 632 (e.g., p-type) coupled between the VDD source rail and the first pull-up passgate circuit 620 and the second pull-up passgate circuit 624. The driver circuit 600 may also optionally include a transistor 634 (e.g., n-type) coupled between the VSS source rail and the first pull-down passgate circuit 622 and the second pull-down passgate circuit 626.

While the driver circuit 600 depicts two pairs of pull-up and pull-down passgate circuits to provide two-phase clock signals QR and QRF (e.g., a first pair including the first pull-up passgate circuit 620 and the first pull-down passgate circuit 622 to provide the QRF signal, and a second pair including the second pull-up passgate circuit 624 and the second pull-down passgate circuit 626 to provide the QR signal), it is understood that some embodiments the driver circuit 600 may only include a single one pair of pull-up and pull-down circuits to provide a single phase clock signal (e.g., either the QR or the QRF signal) without departing from the scope of the disclosure. Implementation of the symmetrical pull-up 420 and 424 and pull-down 422 and 426 passgate circuits driven by the complementary D and DF signals (e.g., provided by a two-phase flip-flop) in the driver circuit 600 may reduce rise and fall time variance for each of the QR and the QRF signals, as compared with circuitry of FIGS. 1 and 2. Reducing variance in the rise and fall times may reduce timing errors as compared with the circuitry of FIGS. 1 and 2.

Figure 7:
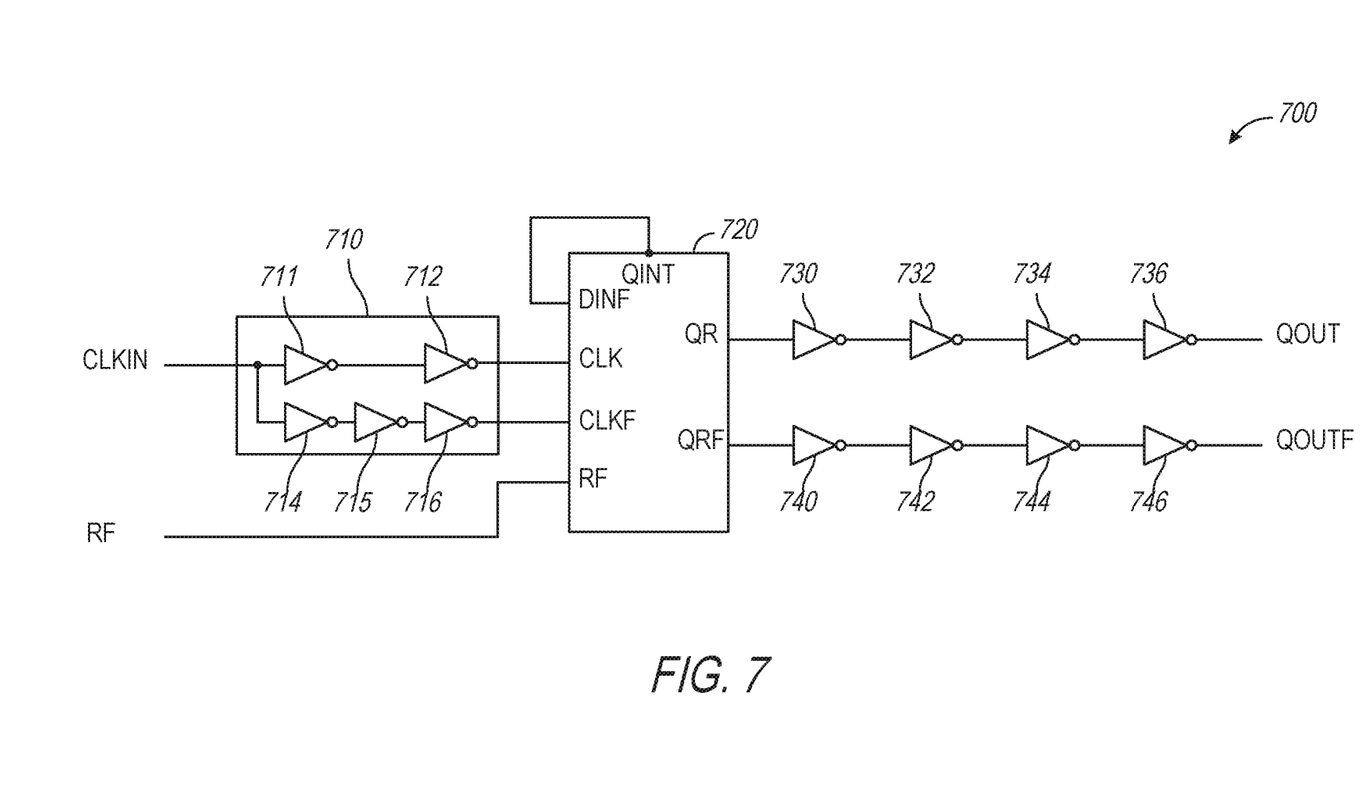
FIG. 7 is a schematic illustration of a two-phase clock circuit in accordance with an embodiment of the disclosure.

FIG. 7 is a schematic illustration of a two-phase clock circuit 700 in accordance with an embodiment of the disclosure. The two-phase clock circuit 700 may include a phase splitter 710, a two-phase flip-flop circuit 720, a first series of inverters 730, 732, 734, and 736, and a second series of inverters 740, 742, 744, and 746. The two-phase clock circuit 700 may receive an input clock signal CLKIN and provide two-phase clock signals QOUT (e.g., true output clock signal) and QOUTF (e.g., complement output clock signal). The QOUT and QOUTF signals are complementary such that the polarity of the QOUT signal is opposite the polarity of the QOUTF signal. Also, because there is only a single two-phase flip-flop circuit 720, the output of QOUT and QOUTF signals have a clock period that is twice as long as the CLKIN signal.

The phase splitter 710 may include serially-coupled inverters 711 and 712 to receive the CLKIN signal and provide a true clock signal CLK to the two-phase flip-flop circuit 720. The phase splitter 710 may further include serially-coupled inverters 714, 715, and 716 to receive the CLKIN signal and provide a complementary clock signal CLKF to the two-phase flip-flop circuit 720. Because there are two serially-coupled inverters 711 and 712 to provide the CLK signal and three serially-coupled inverters 714, 715, and 716 to provide the CLKF signal, the drives strengths of the inverters are adjusted such that the delay through the two serially-coupled inverters 711 and 712 matches the delay through the three serially-coupled inverters 714, 715, and 716.

The two-phase flip-flop circuit 720 may provide an input signal DINF to the output signal QR and the complement output signal QRF in response to the CLK and CLKF signals received from the phase splitter 710. The two-phase flip-flop circuit 720 may include a two-phase flip-flop (e.g., the two-phase flip-flop 400 and/or the two-phase flip-flop 500 of FIG. 5) coupled in series with a driver circuit (e.g., the driver circuit 401 of FIG. 4 and/or the driver circuit 600 of FIG. 6) to provide the QR and QRF signals. An internal output signal QINT may be fed back as the DINF signal, such that the QR and QRF signals transitions to an opposite logic level (e.g., from a high to a low logic level or from a low to a high logic level) with every cycle of the CLK signal. The two-phase flip-flop circuit 720 may further receive a complement reset signal RF to reset the two-phase flip-flop circuit 720.

The QR signal may be provided through the first series of inverters 730, 732, 734, and 736 to provide an output signal QOUT. The first series of inverters 730, 732, 734, and 736 may having increasing drive strength to drive the QOUT signal with more power to downstream circuitry. The QRF signal may be provided through the second series of inverters 740, 742, 744, and 746 to provide a complement output signal QOUTF. The second series of inverters 740, 742, 744, and 746 may having increasing drive strength to drive the QOUTF signal with more power to downstream circuitry.

The use of the two-phase flip-flop circuit 720 may reduce rise and fall times differences on the QOUT and QOUTF signals, which may reduce timing errors as compared with the two-phase circuit 100 of FIG. 1.

Figure 8:
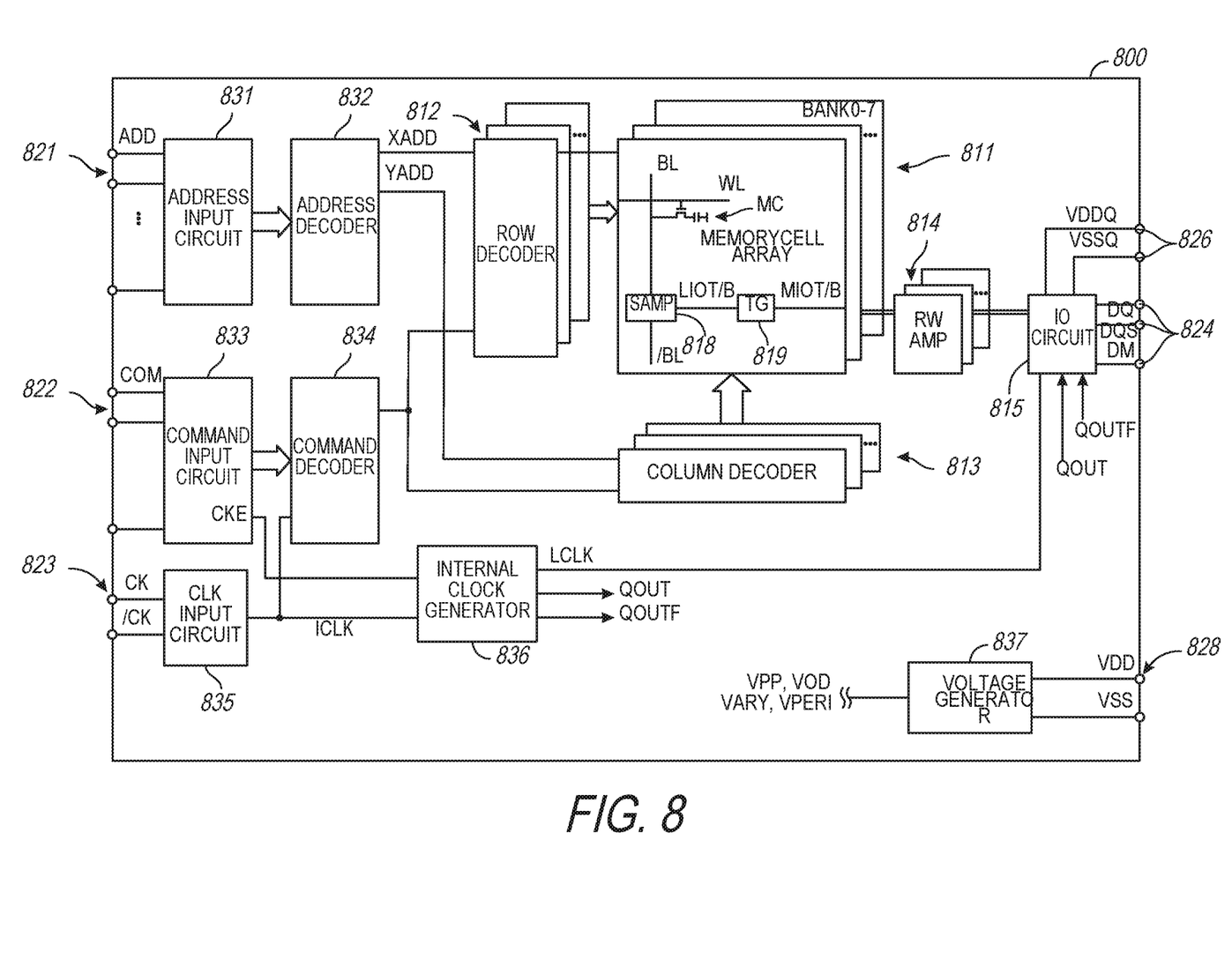
FIG. 8 is a block diagram showing an overall configuration of a semiconductor device in accordance with an embodiment of the disclosure.

FIG. 8 is a block diagram showing an overall configuration of a semiconductor device 800 in accordance with an embodiment of the disclosure. The semiconductor device 800 according to the present embodiment is a synchronous DRAM (SDRAM) of, for example, a Double Data Rate 3 (DDR3) or Double Data Rate 4 (DDR4) type. The semiconductor device 800 may be integrated on a single semiconductor chip and has a memory cell array 811. The memory cell array 811 is provided with a plurality of word lines WL and a plurality of bit lines BL and has a configuration in which memory cells MC are disposed at the intersection points thereof. Selection of the word lines WL is carried out by a row decoder 812, and selection of bit lines BL is carried out by a column decoder 813. The memory cell array 811, the row decoder 812, the column decoder 813, and a read/write amplifier 814 are divided into eight banks BANK0 to BANK7.

Moreover, the semiconductor device 800 is provided with address terminals 821, command terminals 822, clock terminals 823, data terminals 824, and power supply terminals 826 and 828 as external terminals.

The address terminals 821 are the terminals to which address signals ADD are input from outside. The address signals ADD are supplied to an address decoder 832 via an address input circuit 831. The address decoder 832 supplies a row address XADD to the row decoder 812 and supplies a column address YADD to the column decoder 813.

The command terminals 822 are the terminals to which command signals COM are input from outside. The command signals COM are supplied to a command decoder 834 via a command input circuit 833. The command decoder 834 is a circuit which generates various internal commands by decoding the command signals COM. Examples of the internal commands include active signals, pre-charge signals, read/write signals, and refresh signals.

The active signal is a pulse signal which is activated when the command signal COM is indicating row access (active command). When the active signal is activated, the row decoder 812 of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 812 of the specified bank address and the word line WL specified by the row address XADD controlled thereby are deactivated.

The read/write signal is a pulse signal which is activated when the command signal COM is indicating column access (read command or write command). When the read/write signal R/W is activated, the column decoder 813 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 824 to outside via a sense amplifier SAMP 818, a transfer gate TG 819, the read/write amplifier 814, and an input/output circuit 815.

On the other hand, if the active command and the write command are input, if the row address XADD and the column address YADD are input in synchronization with them, and, then, if write data DQ is input to the data terminal 824, the write data DQ is supplied to the memory cell array 811 via the input/output circuit 815, the read/write amplifier 814, the transfer gate TG, and the sense amplifier SAMP and is written to the memory cell MC specified by the row address XADD and the column address YADD. It will be appreciated that the write DQ and the read DQ may include multilevel signals, and the input/output circuit 815 may include circuitry to encode and decode multilevel signals.

The refresh signal is a pulse signal which is activated when the command signal COM is indicating an auto-refresh command. Also, when the command signal COM is indicating a self-refresh entry command, the refresh signal AREF is activated once immediately after command input, thereafter, is cyclically activated at desired internal timing, and a refresh state is continued. By a self-refresh exit command thereafter, the activation of the refresh signal is stopped and returns to an IDLE state.

External clock signals CK and /CK are input to the clock terminals 823. The external clock signals CK and the external clock signals /CK are mutually complementary signals, and both of them are supplied to the clock input circuit 835. The clock input circuit 835 generates internal clock signals ICLK based on the external clock signals CK and /CK. The internal clock signals ICLK are supplied to the command decoder 834, an internal clock generator 836, etc. The internal clock generator 836 generates internal clock signals LCLK, QOUT, QOUTF which control the operation timing of the input/output circuit 815. The internal clock generator 836 may include delay-locked loop (DLL) or phase-locked loop (PLL) circuitry to adjust a phase of the LCLK, QOUT and QOUTF, signals relative to the ICLK signal to align the phase of the DQS signal with the phase of the CK signal. Rather than continuously monitoring the ICLK and LCLK, QOUT and QOUTF signals to detect phase changes (e.g., caused by voltage or temperature drift, or some other cause), the internal clock generator 836 may further include circuitry that indirectly detects whether disturbance in the CK or LCLK, QOUT or QOUTF signals has caused a phase drift that requires re-alignment. The internal clock generator 836 may implement the two-phase flip-flop 400 and the driver circuit 401 of FIG. 1, the two-phase flip-flop 500 of FIG. 5, the driver circuit 600 of FIG. 6, the two-phase clock circuit 700 of FIG. 7, or combinations thereof, to provide the Q OUT and QOUTF signals.

The data terminal 824 also receives data mask signals DM, which, when activated, prohibit corresponding data from being overwritten.

The power supply terminals 828 are the terminals to which power supply potentials VDD and VSS are supplied. The power supply potentials VDD and VSS supplied to the power supply terminals 828 are supplied to a voltage generator 837. The voltage generator 837 generates various internal potentials VPP, VOD, VARY, VPERI, etc. based on the power supply potentials VDD and VSS. The internal potential VPP is the potential mainly used in the row decoder 812, the internal potentials VOD and VARY are the potentials used in the sense amplifier SAMP in the memory cell array 811, and the internal potential VPERI is the potential used in many other circuit blocks.

The power supply terminals 826 are the terminals to which power supply potentials VDDQ and VSSQ are supplied. The power supply potentials VDDQ and VSSQ supplied to the power supply terminals 826 are supplied to the input/output circuit 815. The power supply potentials VDDQ and VSSQ are the same potentials as the power supply potentials VDD and VSS, respectively, which are supplied to the power supply terminals 828. However, the dedicated power supply potentials VDDQ and VSSQ are used for the input/output circuit 815 so that power supply noise generated by the input/output circuit 815 does not propagate to other circuit blocks.

Figure 9:
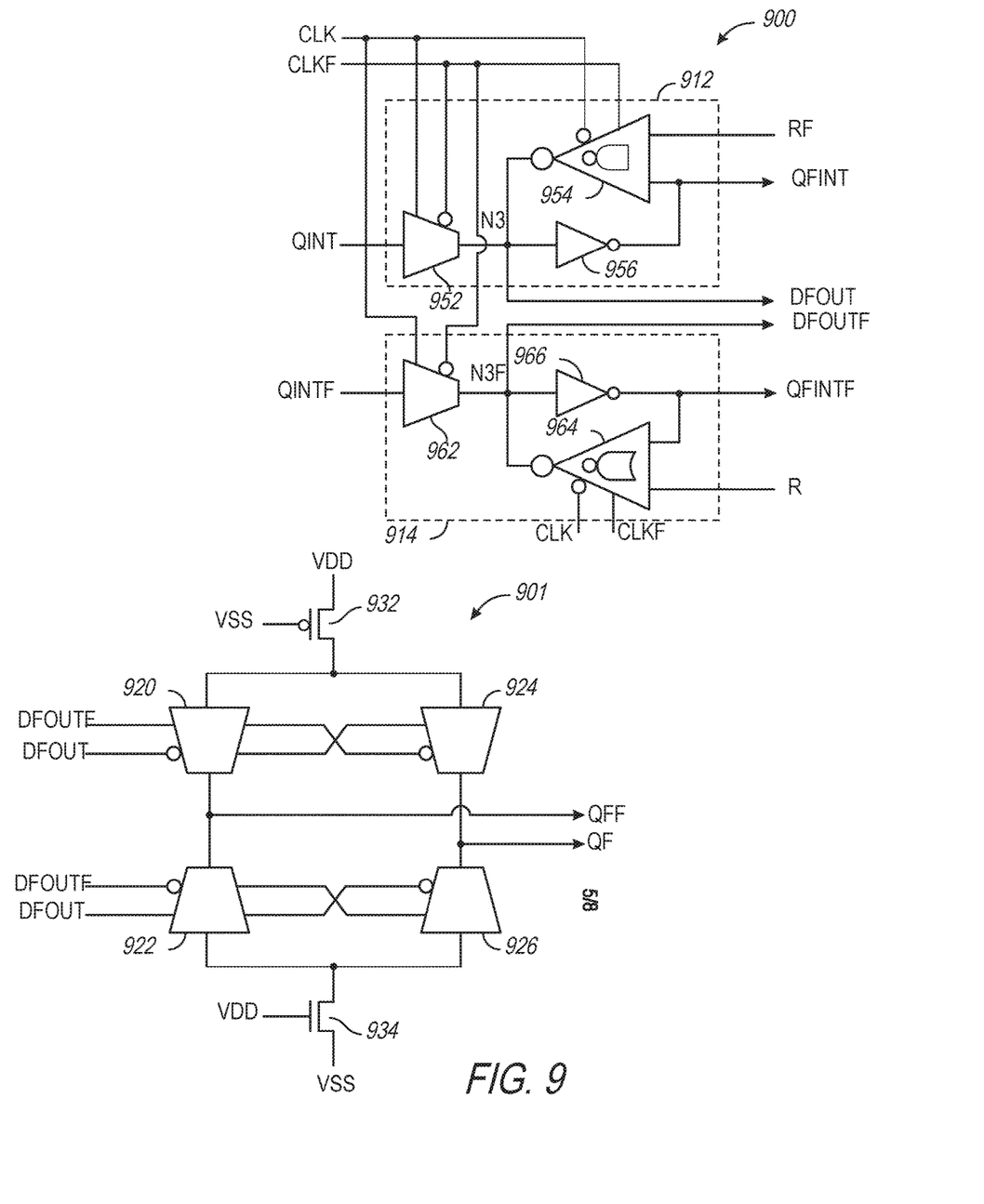
FIG. 9 is a schematic illustration of additional slave latch circuits and driver circuit in a four-phase implementation in accordance with an embodiment of the disclosure.

FIG. 9 is a schematic illustration of additional slave latch circuits 900 and driver circuit 901 in a four-phase implementation in accordance with an embodiment of the disclosure. The additional slave latch circuits 900 may include a third slave latch 912, and a fourth slave latch 914. The additional slave latch circuits 900 may be implemented in as additional slave latches in the two-phase flip-flop 400 of FIG. 4. The additional slave latch circuits 900 and driver circuit 901 may supplement the first slave latch 512 and the second slave latch 514 of FIG. 5, and the driver circuit 600 of FIG. 6 (and/or the first slave latch 412 and the second slave latch 414, and the driver circuit 401 of FIG. 4) to provide four-phase clock signals QR, QF, QRF, and QFF.

The third slave latch 912 may include a passgate 952, a clocked NAND gate 954, and an inverter 956. The fourth slave latch 914 may include a passgate 962, a clocked NOR gate 964, and an inverter 966.

The passgate 952 may receive the QINT signal (e.g., from the output of the first slave latch 412 of FIG. 4 or the first slave latch 512 of FIG. 5) and may provide the QINT signal to node N3 in response to the CLK and CLKF signals. The passgate 552 acts as a latch that holds (e.g., latches) the QINT signal value at the node N3 for a single clock period. The inverter 956 may invert the QINT signal to provide an internal output signal QFINT at an output. The node N3 provides the DFOUT signal (e.g., a third driver control signal). The clocked NAND gate 954 may use NAND logic to provide a signal to the node N3 based on the QFINT signal and the RF signal, with the output of the clocked NAND gate 954 clocked in response to the CLK and CLKF signal. That is, rather than being updated continuously, the output of the clocked NAND gate 954 is only updated periodically in response to the CLK and CLKF signals.

The passgate 962 may receive the QINTF signal (e.g., from the output of the second slave latch 414 of FIG. 4 or the second slave latch 514 of FIG. 5) and may provide the QINTF signal to node N3F in response to the CLK and CLKF signals. The passgate 962 acts as a latch that holds (e.g., latches) the QINTF signal value at the node N3F for a single clock period. Because the passgate 962 and the passgate 952 are both controlled responsive to the CLK and CLKF signals, the passgate 962 and the passgate 952 may each latch the respective signals contemporaneously. The node N3F provides the DFOUTF signal. The inverter 966 may invert the node N3F signal to provide an internal output signal QFINTF at an output. The clocked NOR gate 964 may use NOR logic to provide a signal to the node N3F based on the QINTF signal and a reset signal, with the output of the clocked NOR gate 964 clocked in response to the CLK and CLKF signal. That is, rather than being updated continuously, the output of the clocked NOR gate 964 is only updated periodically in response to the CLK and CLKF signals.

Because circuitry of the third slave latch 912 and the fourth slave latch 914 are similar, the node N3 and the node N3F are both updated at the same time, making the DFOUT and the DFOUTF signals complementary. Further because the QINT and QINTF signals are half of a clock signal behind the node N2 and node N2F signals from the master latch 510 of FIG. 5, the DFOUT and DFOUTF signals have a phase offset from the DOUT and DOUTF signals of 90 degrees, respectively.

The driver circuit 901 may include a third pull-up passgate circuit 920, a third pull-down passgate circuit 922, a fourth pull-up passgate circuit 924, and a fourth pull-down passgate circuit 926. The third pull-up passgate circuit 920 and the third pull-down passgate circuit 922 may drive a complement output signal QFF responsive to the DFOUT signal and the DFOUTF signal (e.g., from the two-phase flip-flop 400 of FIG. 4 or the two-phase flip-flop 500 of FIG. 5). That is, the third pull-up passgate circuit 920 may pull the QFF signal up to a logical high voltage based on a VDD voltage responsive to the DFOUT signal being low and the DFOUTF signal being high. The third pull-down passgate circuit 922 may pull the QFF signal down to a logical low voltage based on a VSS voltage responsive to the DFOUT signal being high and the DFOUTF signal being low. The third pull-up passgate circuit 920 and the third pull-down passgate circuit 922 may include symmetrical circuits such that each has both p-type devices and n-type devices. For example, the third pull-up passgate circuit 920 and the third pull-down passgate circuit 922 may each have a p-type transistor (e.g., controlled by the DFOUT signal in the third pull-up passgate circuit 920 and controlled by the DFOUTF signal in the third pull-down passgate circuit 922) coupled in parallel with an n-type transistor (e.g., controlled by the DFOUTF signal in the third pull-up passgate circuit 920 and controlled by the DFOUT signal in the third pull-down passgate circuit 922).

Similar to the third pull-up passgate circuit 920 and the third pull-down passgate circuit 922, the fourth pull-up passgate circuit 924 and the fourth pull-down passgate circuit 926 may drive a true output signal QF responsive to the DFOUT signal and the DFOUTF signal. The fourth pull-up passgate circuit 924 may pull the QF signal up to a logical high voltage based on the VDD voltage responsive to the DFOUT signal being high and the DFOUTF signal being low. The fourth pull-down passgate circuit 926 may pull the QF signal down to a logical low voltage based on the VSS voltage responsive to the DFOUT signal being low and the DFOUTF signal being high. The QF and QFF signals are complementary such that the polarity of the QF signal is opposite the polarity of the QFF signal. The fourth pull-up passgate circuit 924 and the fourth pull-down passgate circuit 926 may include symmetrical circuits such that each includes both p-type devices and n-type devices. For example, the fourth pull-up passgate circuit 924 and the fourth pull-down passgate circuit 926 may each have a p-type transistor (e.g., controlled by the DFOUTF signal in the fourth pull-up passgate circuit 924 and controlled by the DFOUT signal in the fourth pull-down passgate circuit 926) coupled in parallel with an n-type transistor (e.g., controlled by the DFOUT signal in the fourth pull-up passgate circuit 924 and controlled by the DFOUTF signal in the fourth pull-down passgate circuit 926). Using the symmetrical circuits in the fourth pull-up passgate circuit 924 and the fourth pull-down passgate circuit 926 may reduce rise and fall time variance for the QF signal, as compared with circuitry of FIGS. 1 and 2. Because the DFOUT and DFOUTF signals have a phase offset from the DOUT and DOUTF signals of 90 degrees, respectively, the QF and QFF signals also have a phase offset from the QR and QRF signals of 90 degrees, respectively.

The driver circuit 900 may optionally include a transistor 932 (e.g., p-type) coupled between the VDD source rail and the third pull-up passgate circuit 920 and the fourth pull-up passgate circuit 924. The driver circuit 900 may also optionally include a transistor 934 (e.g., n-type) coupled between the VSS source rail and the third pull-down passgate circuit 922 and the fourth pull-down passgate circuit 926.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
 a clock generator circuit comprising a two-phase flip-flop circuit configured to provide a first output signal and a second output signal, wherein the two-phase flip-flop circuit comprises a two-phase flip-flop coupled in series with a driver circuit, wherein the two-phase flip-flop is configured to provide, to the driver circuit, both a first driver control signal and a second driver control signal directly responsive to a same clock signal, wherein the first driver control signal and the second driver control signal are complementary, wherein first circuitry of the driver circuit is configured to provide the first output signal responsive to both of the first driver control signal and the second driver control signal, wherein second circuitry of the driver circuit is configured to provide the second output signal responsive to both of the first driver control signal and the second driver control signal, wherein the first output signal and the second output signal are complementary, wherein the first circuitry of the driver circuit comprises a pull-up passgate circuit configured to drive the first output signal to a logical high value responsive to the first and second control signals having first complementary values and a pull-down passgate circuit configured to drive the first output signal to a logical low value responsive to the first and second control signals having second complementary values, wherein the pull-up passgate circuit and the pull-down passgate circuit are each controlled by both of the first and second control signals.

2. The apparatus of claim 1, wherein the two-phase flip-flop comprises:

a first circuit configured to receive a first signal and to propagate the first signal to a first output node in response to the same clock signal to provide the first driver control signal; and
 a second circuit configured to receive a complement of the first signal and to propagate the complement of the first signal to a second output node in response to the same clock signal to provide the second driver control signal.

3. The apparatus of claim 2, wherein a third circuit configured to receive an input signal and to provide the first signal at a third output node in response to the same clock signal and based on the input signal.

4. The apparatus of claim 3, wherein the third circuit comprises an inverter coupled to the third output node and configured to provide the complement of the first signal.

5. The apparatus of claim 3, wherein the third circuit comprises a clocked inverter configured to propagate the input signal to an output in response to the same clock signal, wherein the first signal is based on the output of the clocked inverter.

6. The apparatus of claim 5, wherein the third circuit further comprises a logic gate coupled between the clocked inverter and the third output node, wherein the logic gate is configured to provide the first signal to the output node based on an output of the clocked inverter and a reset signal.

7. The apparatus of claim 2, wherein the first circuit comprises a passgate configured to propagate the first signal to the first output node responsive to the same clock signal.

8. The apparatus of claim 2, wherein the second circuit comprises a passgate configured to propagate the complement of the first signal to the second output node responsive to the same clock signal.

9. The apparatus of claim 1, wherein the clock generator circuit further comprises a phase splitter configured to provide the same clock signal and a complementary clock signal responsive to an input clock signal.

10. The apparatus of claim 1, wherein the clock generator circuit further comprises:

a first series of inverters configured to drive the first output signal to downstream circuitry; and
 a second series of inverters configured to drive the second output signal to the downstream circuitry, wherein a count of the first series of inverters is equal to a count of the second series of inverters.

11. The apparatus of claim 1, wherein the second circuitry of the driver circuit comprises a second pull-up circuit configured to drive the second output signal to the logical high value responsive to the first and second control signals and a second pull-down circuit configured to drive the second output signal to the logical low value responsive to the first and second control signals.

12. The apparatus of claim 1, wherein circuitry of the pull-up passgate circuit is schematically equivalent to circuitry of the pull-down passgate circuit.

13. A method, comprising:
 receiving a clock signal at a clock generator circuit;
 providing, via a two-phase flip-flop of the clock generator circuit, both a first driver control signal and a second driver control signal directly responsive to the clock signal, wherein the first driver control signal and the second driver control signal are complementary;
 providing, via a first driver circuit of the clock generator circuit, a first output signal responsive to both of the first driver control signal and the second driver control signal, wherein providing the first output signal includes:

driving, via a first passgate of the first driver circuit, the first output signal to a first logical value in response to the first and second control signals having first respective complementary values; and driving, via a second passgate of the first driver circuit, the first output signal to a second logical value in response to the first and second control signals having second respective complementary values, wherein the first passgate and the second passgate are each controlled by both of the first and second control signals; and providing, via a second driver circuit of the clock generator circuit that is coupled in parallel with the first driver circuit, a second output signal responsive to both of the first driver control signal and the second driver control signal, wherein the first output signal and the second output signal are complementary.

14. The method of claim 13, wherein circuitry of the first passgate is equivalent to circuitry of the second passgate.

15. The method of claim 13, further comprising causing the first driver control signal and the second driver control signal to transition to opposite logical values contemporaneously.

16. A method comprising:
receiving a clock signal at a clock generator circuit;
providing, via a two-phase flip-flop of the clock generator circuit, both a first driver control signal and a second driver control signal directly responsive to the clock signal, wherein the first driver control signal and the second driver control signal are complementary;

providing, via a first driver circuit of the clock generator circuit, a first output signal responsive to both of the first driver control signal and the second driver control signal, wherein providing the first output signal includes:
driving, via a first passgate of the first driver circuit, the first output signal to a first logical value in response to the first and second control signals having first respective complementary values; and
driving, via a second passgate of the first driver circuit, the first output signal to a second logical value in response to the first and second control signals having second respective complementary values providing, via a second driver circuit of the clock generator circuit that is coupled in parallel with the first driver circuit, a second output signal responsive to both of the first driver control, signal and the second driver control signal, wherein the first output signal and the second output signal are complementary, wherein providing the second output signal includes:
driving, via a third passgate of the second driver circuit, the second output signal to the second logical value in response to the first and second control signals having the first respective complementary values; and
driving, via a fourth passgate of the second driver circuit, the second output signal to the first logical value in response to the first and second control signals having the second respective complementary values.

* * * * *